United States Patent [19]

Tamamura et al.

[11] Patent Number: 4,933,576
[45] Date of Patent: Jun. 12, 1990

[54] GATE ARRAY DEVICE HAVING MACRO CELLS FOR FORMING MASTER AND SLAVE CELLS OF MASTER-SLAVE FLIP-FLOP CIRCUIT

[75] Inventors: Masaya Tamamura, Inagi; Shinji Emori, Urawa; Yoshio Watanabe; Isao Shimotsuhama, both of Kawasaki, all of Japan

[73] Assignee: Fujitsu Limited, Kawasaki, Japan

[21] Appl. No.: 349,076

[22] Filed: May 9, 1989

[30] Foreign Application Priority Data

May 13, 1988 [JP] Japan .................................. 63-117636
May 13, 1988 [JP] Japan .................................. 63-117635
May 13, 1988 [JP] Japan .................................. 63-117637

[51] Int. Cl.⁵ ......................................... H03K 19/177
[52] U.S. Cl. ................................. 307/465; 307/272.2; 307/303.1; 307/467; 357/45
[58] Field of Search ................. 307/443, 455, 465–467, 307/272.2, 303, 303.1; 357/45; 364/491; 365/154

[56] References Cited

U.S. PATENT DOCUMENTS

| | | | |
|---|---|---|---|
| 4,207,556 | 6/1980 | Sugiyama et al. | 307/467 X |
| 4,255,672 | 3/1981 | Ohno et al. | 307/455 |
| 4,593,205 | 6/1986 | Bass et al. | 307/467 X |
| 4,611,236 | 9/1986 | Sato | 357/45 |
| 4,750,027 | 6/1988 | Asami | 357/45 |
| 4,760,289 | 7/1988 | Eichelberger et al. | 307/465 X |
| 4,851,717 | 7/1989 | Yabe | 307/303 |
| 4,864,381 | 9/1989 | Seeteldt et al. | 357/45 |
| 4,868,630 | 9/1989 | Tanizawa et al. | 357/45 |

FOREIGN PATENT DOCUMENTS

| | | | |
|---|---|---|---|
| 0080361 | 6/1983 | European Pat. Off. | 357/45 M |
| 0064046 | 4/1983 | Japan | 357/45 M |

Primary Examiner—David Hudspeth
Attorney, Agent, or Firm—Staas & Halsey

[57] ABSTRACT

A gate array device forms an arbitrary logic circuit depending on interconnections formed thereon, and comprises a semiconductor chip having an approximate rectangular shape, an input terminal region including a plurality of input terminals formed at a peripheral portion of the semiconductor chip, an output terminal region including a plurality of output terminals formed at a peripheral portion of the semiconductor chip, and a macro cell region including a plurality of macro cells formed at a central portion of the semiconductor chip. The macro cells include first macro cells and second macro cells, where each of the first macro cells include a minimum number of elements for forming a master part of a master-slave flip-flop circuit and each of the second macro cells include at least a minimum number of elements for forming a slave part of the master-slave flip-flop circuit. The first macro cells and the second macro cells make macro cell pairs and are regularly arranged within the macro cell region.

20 Claims, 15 Drawing Sheets

GATE ARRAY DEVICE HAVING MACRO CELLS FOR FORMING MASTER AND SLAVE CELLS OF MASTER-SLAVE FLIP-FLOP CIRCUIT

BACKGROUND OF THE INVENTION

The present invention generally relates to gate array devices, and more particularly to a gate array device having macro cells which are suited for forming a master-slave flip-flop circuit.

Recently, the demand for a gate array device is increasing because the time and cost required to develop the gate array device are reasonably small. With such an increase in the demand for the gate array device, there are new demands on the gate array device. The new demands include improved integration density and utilization efficiency of cells, a high-speed operation especially in the fields such as optical transmission and high-speed measuring instruments which use extremely high-speed (high-frequency) signals, and low noise and skew characteristics especially when supporting the high-speed operation.

FIG. 1 generally shows a conventional gate array device. The gate array device comprises a rectangular semiconductor chip 101, and terminals 102 for input/output signals and power source voltages are arranged in a peripheral portion of the chip 101. Input/output parts 104 are arranged on the inner side of the terminals 102 via interconnection regions 103. Cells exclusively for the input/or output signals are provided in the input/output parts 104. A macro cell array 105 is arranged at a central portion of the chip 101. Each macro cell of the macro cell array 105 is a unit cell which forms a logic circuit. Usually, an OR circuit, a NOR circuit, an exclusive-OR circuit, an exclusive-NOR circuit, an AND circuit, a NAND circuit or the like may be formed from one macro cell. The macro cells of the macro cell array 105 have identical constructions and are regularly arranged in a matrix arrangement. An arbitrary logic circuit can be formed by selectively connecting the macro cells by interconnections.

FIG. 2 shows an example of a signal flow within the gate array device shown in FIG. 1. Signal received at the input terminals 102 are supplied directly to the macro cell array 105 and indirectly to the macro cell array 105 through an input cell of the input/output part 104. The signals supplied to the macro cell array 105 are subjected to a logic operation, and a signal output from the macro cell array 105 is supplied to the output terminal 102 through an output cell of the input/output part 104.

Generally, the gate array device has identical macro cells which are arranged in an array, and there is no positional restrictions on a logic circuit which is to be formed in the array of macro cells. In other words, the conventional gate array device is made with priority on the degree of freedom of design so that the circuit arrangement and the interconnections may be freely designed. In addition, the conventional gate array device has a form symmetric design such that the signal input and output can be made from any terminal. Therefore, an arbitrary logic circuit can be formed anywhere within the array of macro cells.

On the other hand, from the point of view of high-speed operation, it is preferable to use one cell to realize a desired function rather than to use a plurality of cells.

For example, when a master-slave flip-flop circuit is formed from cells which can only form a basic gate, eight gates (cells) are required as may be seen from FIG. 3. But in this case, a signal passes through a plurality of gates and results in a decrease in the operation speed. In FIG. 3, the master-slave flip-flop circuit has a terminal C for receiving a clock signal, a terminal S for receiving a set signal, a terminal R for receiving a reset signal, terminals D1 and D2 for receiving two input data signals, and terminals X and X for outputting output signals of the master-slave flip-flop circuit.

Recently, there is a demand to reduce the number of cells in order to realize the high-speed operation. And in order to make it possible to form various logic circuits from one macro cell, the cell size is increasing due to an increase in the number of elements (transistors, resistors and the like) within the macro cell.

In general, the master-slave flip-flop circuit requires the largest number of elements in the gate array device. On the other hand, because a master part and a slave part of the master-slave flip-flop circuit have extremely similar constructions, there are proposals to form one master-slave flip-flop circuit from two macro cells having identical constructions.

In the master-slave flip-flop circuit, the number of elements (transistors, diodes, resistors, capacitors and the like) within the slave part is smaller than the number of elements within the master part. However, because the conventional master-slave flip-flop circuit uses two identical macro cells to constitute the slave part and the master part, a large number of elements remain unused within the macro cell which forms the slave part and the utilization efficiency of the elements within the macro cell is poor. As a result, there is a problem in that the integration density of the macro cell array as a whole cannot be improved.

On the other hand, because the conventional gate array device has the form symmetrical design as shown in FIG. 1, complex interconnections are necessary depending on the logic circuit to be formed, and the lengths of the interconnections from an input terminal to an output terminal are various and relatively long. In many cases, the complex interconnections are extremely close to each other and cross in a plan view. In such a case, the input terminal and the output terminal are often adjacent to each other and a signal interference is likely to occur between the input and output terminals.

SUMMARY OF THE INVENTION

Accordingly, it is a general object of the present invention to provide a novel and useful gate array device in which the problems described above are eliminated.

Another and more specific object of the present invention is to provide a gate array device which forms an arbitrary logic circuit depending on interconnections formed thereon, comprising a semiconductor chip having an approximate rectangular shape, an input terminal region including a plurality of input terminals formed at a peripheral portion of the semiconductor chip, an output terminal region including a plurality of output terminals formed at a peripheral portion of the semiconductor chip, and a macro cell region including a plurality of macro cells formed at a central portion of the semiconductor chip. The macro cells include first macro cells and second macro cells, where each of the first macro cells include a minimum number of elements for forming a master part of a master-slave flip-flop circuit and each of the second macro cells include at least a minimum number of elements for forming a slave part of the master-slave flip-flop circuit. The first macro cells and the second macro cells make macro cell pairs and are regularly arranged within the macro cell region. According to the gate array device of the present invention, it is possible to reduce a number of unused elements when the master-slave flip-flop circuit is formed, and the integration density of the gate array device can be improved. Moreover, signal interference between the input and output terminals is reduced because the input terminal region is independent and separated from the output terminal region.

Still another object of the present invention is to provide the gate array device wherein the macro cell region is made up of a first region and a second region which are bounded on a boundary, and the first and second macro cells have a form symmetrical arrangement about the boundary. According to the gate array device of the present invention, it is possible to facilitate the design of the logic circuit which is to be formed, and a flow of signals can be directed generally along a predetermined direction. In addition, it is possible to avoid the interconnections from intersecting each other, and the lengths of the interconnections can be made short and uniform.

A further object of the present invention is to provide the gate array device wherein the semiconductor chip sequentially has first through fourth sides, and the input terminal region is arranged at least along the first side of the semiconductor chip while the output terminal region is arranged at least along the third side of the semiconductor chip. The first side confronts the third site. According to the gate array device of the present invention, a flow of signals can be directed generally along a predetermined direction. It is also possible to avoid the interconnections from intersecting each other, and the lengths of the interconnections can be made short and uniform.

Another object of the present invention is to provide the gate array device which further comprises a power source terminal region formed between the input terminal region and the output terminal region, which power source terminal region includes at least one power source terminal. According to the gate array device of the present invention, it is possible to positively prevent signal interference between the input and output terminals.

Other objects and further features of the present invention will be apparent from the following detailed description when read in conjunction with the accompanying drawings.

BRIEF DESCRIPTION OF THE DRAWINGS

FIGS. 5 through 8 respectively show embodiments of layout patterns of the macro cells shown in FIG. 4;

DETAILED DESCRIPTION

Figure 4:
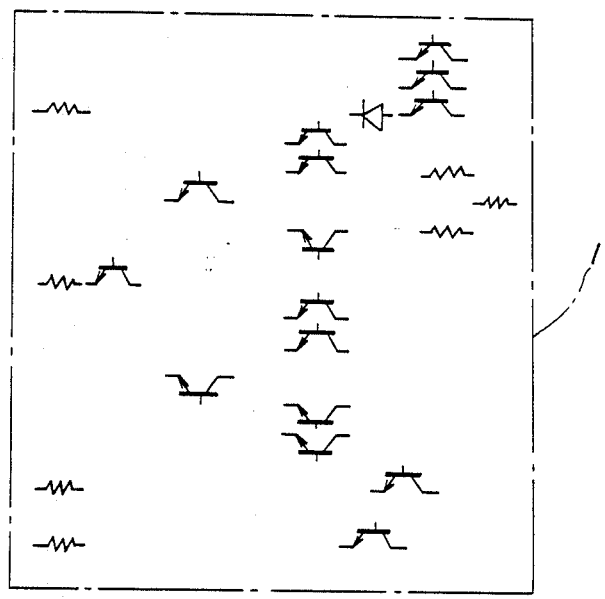
FIG. 4 generally shows two kinds of macro cells which are used in a first embodiment of a gate array device according to the present invention.
Figure 4:
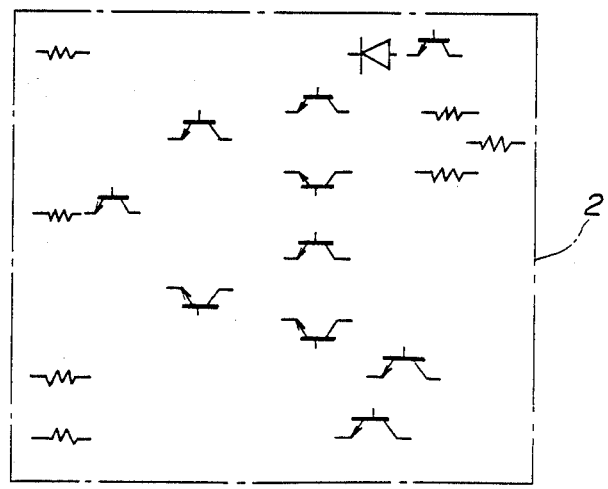

FIG. 4 generally shows two kinds of macro cells which are used in a first embodiment of a gate array device according to the present invention. A macro cell 1 which is suited for forming a master part of a master-slave flip-flop circuit includes fifteen (15) transistors, one (1) diode, and seven (7) resistors. There is no unused element when the macro cell 1 forms the master part. A macro cell 2 which is suited for forming a slave part of the master-slave flip-flop circuit includes ten (10) transistors, one (1) diode, and seven (7) resistors. By considering the flexibility of the macro cell 2 for use in forming a circuit other than the slave part, the macro cell 2 includes in addition to the minimum number of elements required to form the slave part one (1) transistor, one (1) diode, and one (1) resistor. The number of elements included in macro cell 2 is smaller than the number of elements included in the macro cell 1, and the cell area of the macro cell 2 is smaller than the cell area of the macro cell 1. The macro cells 1 and 2 form a pair and are arranged adjacent to each other.

In this embodiment, the macro cells 1 and 2 have identical widths, and the height of the macro cell 2 is lower than the height of the macro cell 1. For this reason, an area occupied by the macro cell 2 is smaller than an area occupied by the macro cell 1.

FIGS. 5 through 8 respectively show portions of embodiments of layout patterns of the macro cells shown in FIG. 4.

Figures 5, 6, 7, 8:
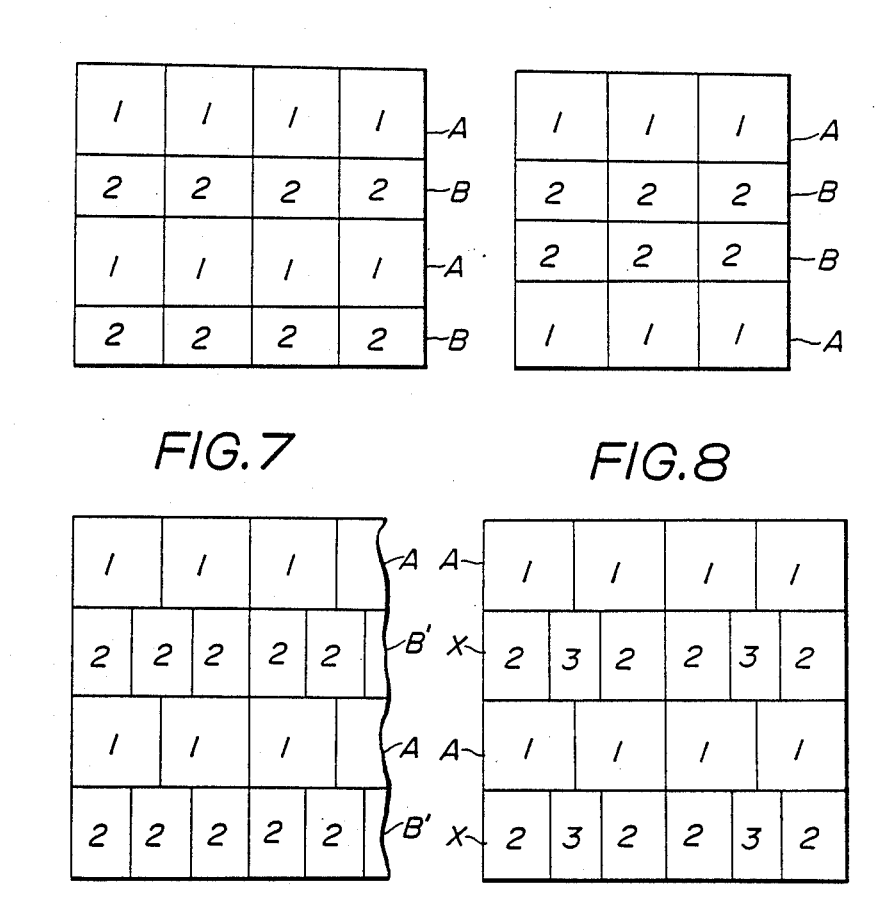

In FIG. 5, the gate array device has a row A of the macro cells 1 extending horizontally, and a row B of the macro cells 2 extending horizontally. In a vertical direction, the row A of the macro cells 1 and the row B of the macro cells 2 are alternately arranged. The widths of the macro cells 1 and 2 in the horizontal direction are the same. Accordingly, the number of macro cells 1 arranged in the row A is the same as the number of macro cells 2 arranged in the row B.

In FIG. 6, the combination of the rows A and B in the gate array device is different from that shown in FIG. 5. In other words, a basic pattern in the vertical direction is made up of the row A, the row B, the row B, and the row A, and this basic pattern is repeated. By repeating this basic pattern, the rows A become paired and the rows B become paired, thereby making the arrangement especially suited when the inputs to the macro cells and the outputs from the macro cells are to be collected.

In FIG. 7, the layout is similar to that of FIG. 5 in that both the row A of the macro cells 1 and a row B' of the macro cells 2 extend horizontally and the rows A and B' are alternately arranged. However, the orientation of the macro cells 2 of the row B' is rotated 90 with respect to the orientation of the macro cells 2 of the row B shown in FIG. 5. Because the short sides of the macro cells 2 are aligned horizontally, each row B' includes in addition to the macro cells 2 which correspond to the macro cells 1 of the adjacent row A additional macro cells 2 which may be used for arbitrary purposes.

The macro cell array may include macro cells other than the macro cells 1 which are suited for forming the master part and the macro cells 2 which are suited for forming the slave part of the master-slave flip-flop circuit. FIG. 8 shows a layout in which three kinds of macro cells are provided. In FIG. 8, the gate array device has the row A of the macro cells 1 extending horizontally, and a row X of the macro cells 2 and 3 extending horizontally. The orientation of the macro cells 2 of the row X is rotated 90 degrees with respect to the orientation of the macro cells 2 of the row B in FIG. 5. In the vertical direction, the row A of the macro cells 1 and the row X of the macro cells 2 and 3 are alternately arranged. In each row X, a basic pattern in the horizontal direction is made up of the macro cell 2, the macro cell 3, and the macro cell 2, and this basic pattern is repeated in the horizontal direction. The macro cell 3 is smaller than the macro cell 2 and is suited for forming a bias voltage source circuit, for example. However, it is of course not essential that the macro cell 3 is smaller than the macro cell 2.

Figure 1:
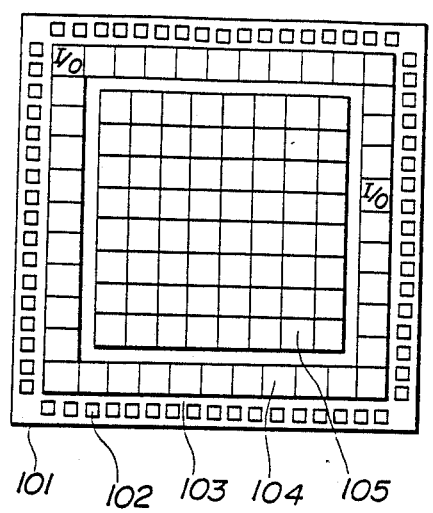
FIG. 1 is a plan view generally showing an example of a conventional gate array device.
Figure 2:
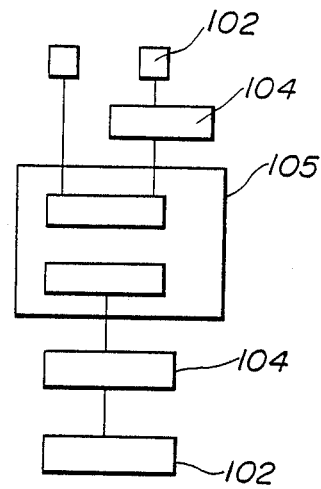
FIG. 2 is a diagram for explaining an example of a signal flow in the conventional gate array device shown in FIG. 1.
Figure 3:
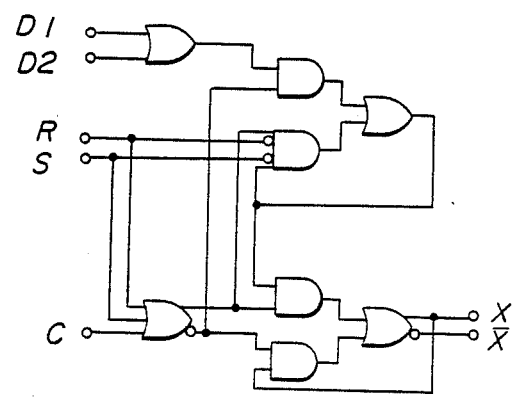
FIG. 3 is a circuit diagram showing a masterslave flip-flop circuit formed from basic gates.
Figure 9:
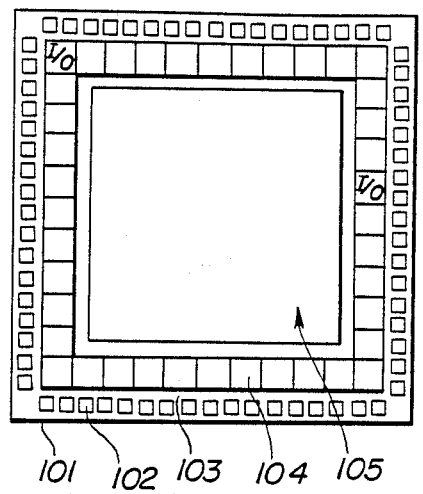
FIG. 9 is a plan view generally showing the first embodiment of the gate array, device according to the present invention.

FIG. 9 generally shows the first embodiment of the gate array device according to the present invention. In FIG. 9, those parts which are basically the same as those corresponding parts in FIG. 1 are designated by the same reference numerals, and a description thereof will be omitted. In FIG. 9, a macro cell array 5 has the macro cells 1 and 2 shown in FIG. 4 which are arranged in any of the layouts shown in FIGS. 5 through 8.

Figure 10:
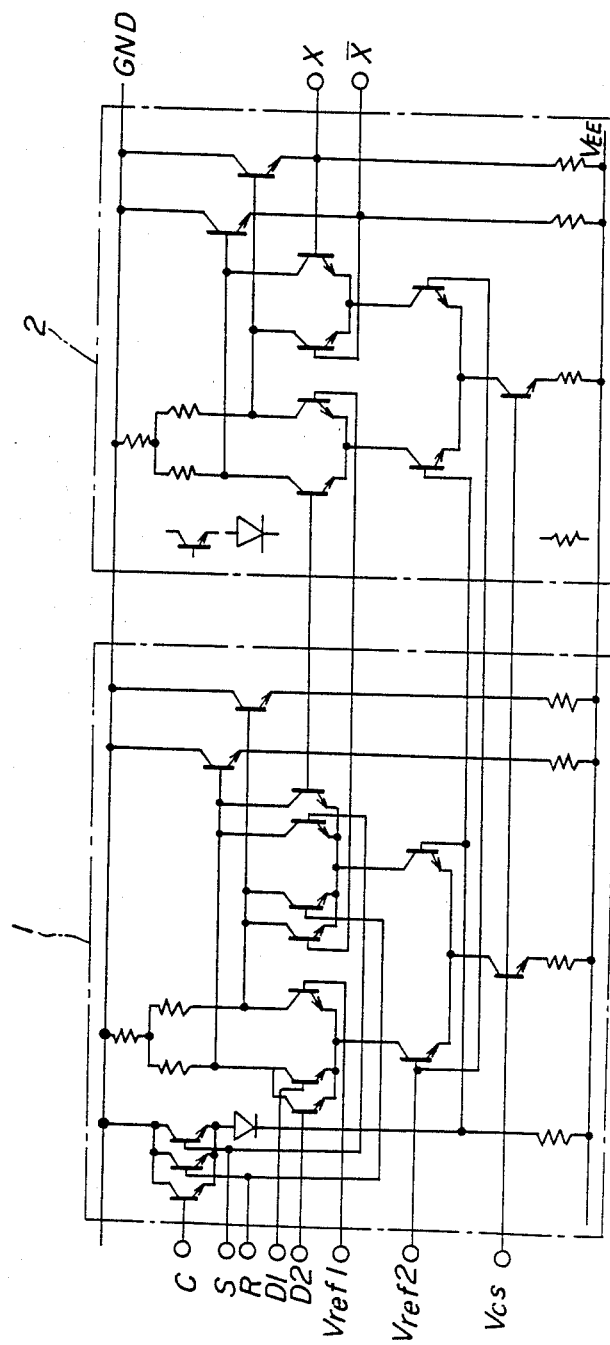
FIG. 10 is a circuit diagram showing a 2-input master-slave flip-flop circuit formed from the macro cells shown in FIG. 4.

Next, a description will be given of logic circuits which are formed from the macro cells 1 and 2 of the first embodiment, by referring to FIGS. 10, 11A, 11B, 12A and 12B. In FIG. 10 and figures which follow, GND and $V_{EE}$ denote power source voltages.

FIG. 10 shows a 2-input master-slave flip-flop circuit which has set and reset functions and is formed from the macro cells 1 and 2. A master part of the 2-input master-slave flip-flop circuit is formed from the macro cell 1, while a slave part of this 2-input master-slave flip-flop circuit is formed from the macro cell 2. There are no unused elements within the macro cell 1. On the other hand, because the macro cell 2 is designed by considering the flexibility of the macro cell 2 for use in forming a circuit other than the slave part, the unused elements within the macro cell 2 are one (1) transistor, one (1) diode, and one (1) resistor. In FIG. 10, the 2-input master-slave flip-flop circuit has a terminal C for receiving a clock signal, a terminal S for receiving a set signal, a terminal R for receiving a reset signal, terminals D1 and D2 for receiving two input data signals, terminals Vref1 and Vref2 for receiving reference voltages, a terminal Vcs for receiving a chip select signal, and terminals X and X for outputting output signals of the 2-input master-slave flip-flop circuit.

As may be seen from FIG. 10, the number of elements required to form the master part is large compared to the number of elements required to form the slave part. The large number of elements required in the master part is due to an emitter follower which includes transistors, a diode, and a resistor for receiving the clock signal, and a set and reset circuit which includes transistors for supporting the set and reset functions. On the other hand, the slave part does not require the emitter follower and the set and reset circuit. Therefore, the size of the macro cell 1 is larger than that of the macro cell 2.

Figure 11A:
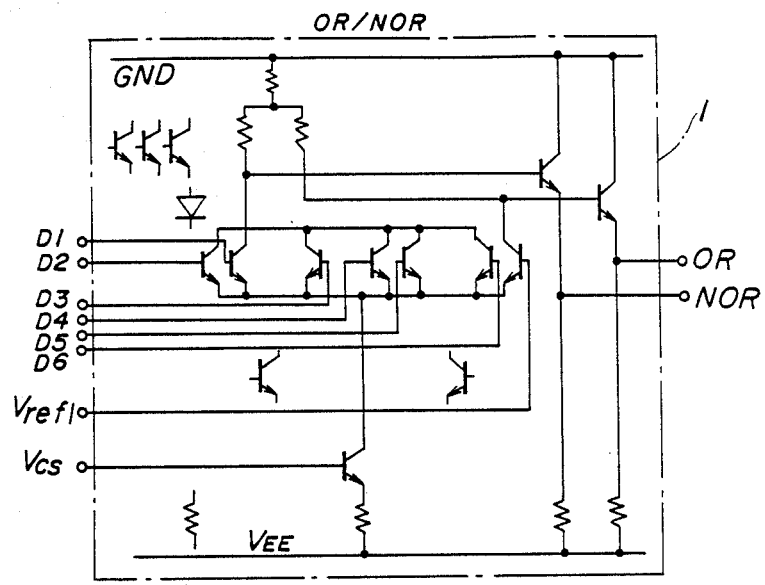
FIGS. 11A and 11B are circuit diagrams respectively showing OR/NOR circuits formed from the macro cells shown in FIG. 4.
Figure 11B:
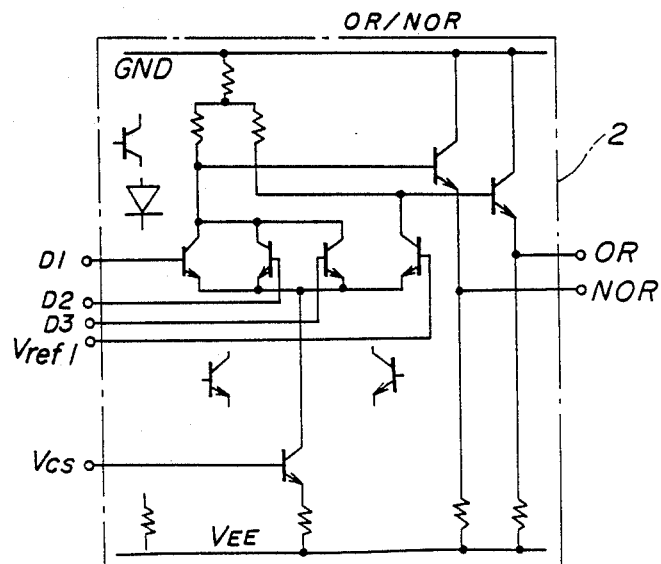

FIG. 11A shows a 6-input OR/NOR circuit which is formed from the macro cell 1, and FIG. 11B shows a 3-input OR/NOR circuit which is formed from the macro cell 2. In FIGS. 11A and 11B, those part which are substantially the same as those corresponding parts in FIG. 10 are designated by the same reference numerals, and a description thereof will be omitted. In FIGS. 11A and 11B, D1 through D6 denote terminals for receiving input data signals, and OR and NOR respectively denote terminals for outputting output signals of the OR circuit and the NOR circuit.

Figure 12A:
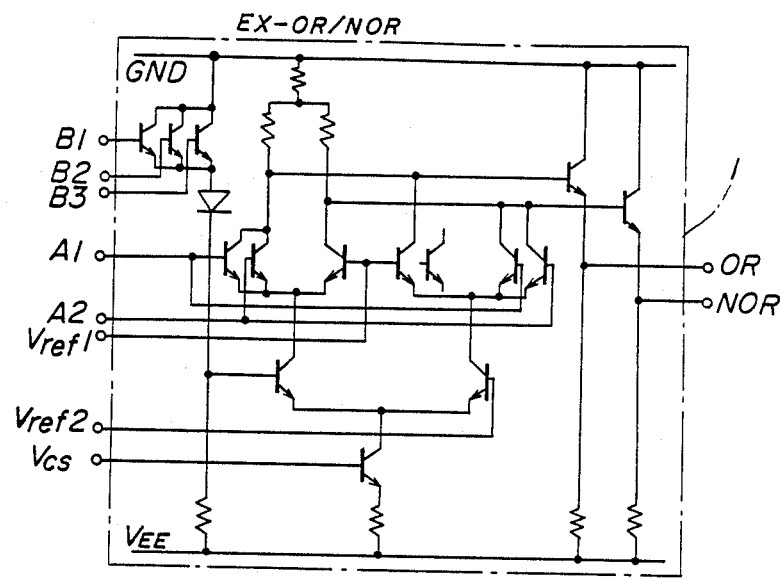
FIGS. 12A and 12B are circuit diagrams respectively showing exclusive-OR/NOR circuits formed from the macro cells shown in FIG. 4.
Figure 12B:
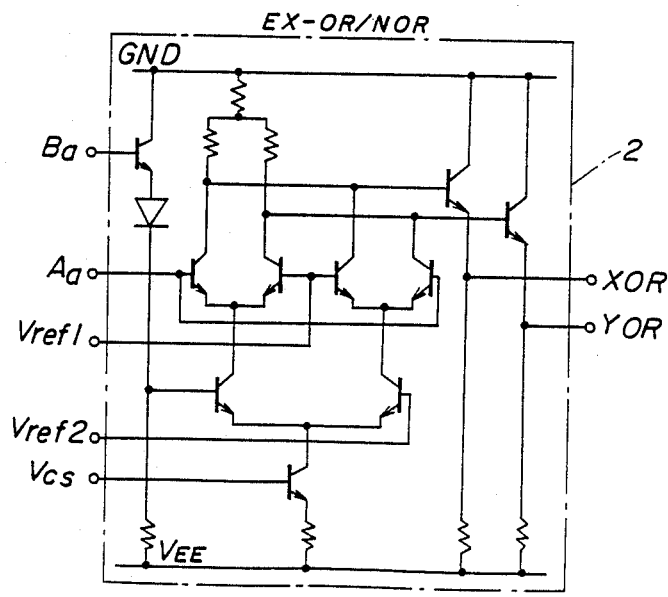

FIG. 12A shows a 2-3-input exclusive-OR/NOR circuit which is formed from the macro cell 1, and FIG. 12B shows a 2-input exclusive-OR/NOR circuit which is formed from the macro cell 2. In FIGS. 12A and 12B, those part which are substantially the same as those corresponding parts in FIG. 10 are designated by the same reference numerals, and a description thereof will be omitted. In FIGS. 12A and 12B, B1 through B3, A1, A2, Aa and Ba denote terminals for receiving input data signals, and XOR and XNOR respectively denote terminals for outputting output signals of the exclusive-OR circuit and the exclusive-NOR circuit. The number of unused elements of the macro cell 2 is zero in FIG. 12B. Although some unused elements exist in the macro cell 2 when the circuits shown in FIGS. 10 and 11B are formed from the macro cell 2, the degree of freedom of the circuit design is improved by the provision of these unused elements because it becomes possible to form the exclusive-OR/NOR circuit shown in FIG. 12B from the macro cell 2.

Figure 13:
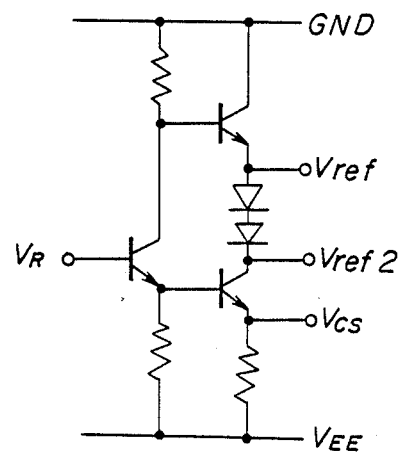
FIG. 13 is a circuit diagram showing a bias power source circuit formed from a macro cell shown in FIG. 8.

FIG. 13 is a circuit diagram showing a bias power source circuit formed from the macro cell 3 shown in FIG. 8. The transistors, diodes, and resistors of the macro cell 3 are connected as shown to generate three bias voltages Vref1, Vref2, and Vcs from a reference voltage $V_R$.

In this embodiment, the transistors of the macro cells are described as bipolar transistors for the sake of convenience, but it is of course possible to use other types of transistors such as field effect transistors (FETs). In addition, it is possible to use elements other than those shown in FIG. 4 for the macro cells. Furthermore, the master-slave flip-flop circuit shown in FIG. 10 employs series gate type emitter coupled logic (ECL) circuits, but it is of course possible to employ other circuits such as a source coupled FET logic (SCFL) circuit.

Figure 14:
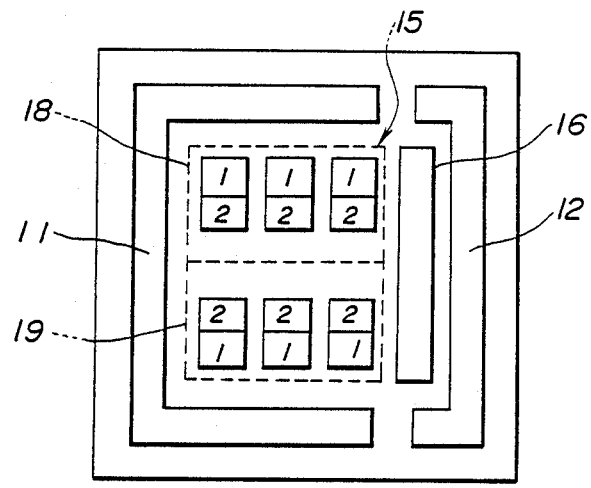
FIG. 14 is a plan view generally showing a second embodiment of the gate array device according to the present invention for explaining the basic concept thereof.

Next, a description will be given of a second embodiment of the gate array device according to the present invention. FIG. 14 generally shows the second embodiment for explaining the basic concept thereof. In FIG. 14, a gate array device has an input terminal region 11 which includes a group of input terminals, an output terminal region 12 which includes a group of output terminals, the macro cells 1 which are suited for forming master parts of master-slave flip-flop circuits, the macro cells 2 which are suited for forming slave parts of the master-slave flip-flop circuits, a macro cell region 15 in which macro cell pairs of the macro cells 1 and 2 are arranged in an array, an output buffer region 16 which includes a group of output buffers, an upper region 18 which is an upper portion of the macro cell region 15, and a lower region 19 which is a lower portion of the macro cell region 15.

The regions of the gate array device are oriented such that the input terminal region 11, the macro cells 1, and the macro cells 2 are arranged from the two mutually confronting sides (top and bottom sides in FIG. 14) towards the central portion of the gate array device. In addition, the macro cell pairs are approximately form symmetrical on the upper and lower regions 18 and 19 of the macro cell region 15, and the arranging sequence of the macro cells 1 and 2 from the top side towards the central portion of the gate array device is in reverse to the arranging sequence of the macro cells 2 and 1 from the central portion towards the bottom side of the gate array device. Furthermore, the macro cell 2 occupies an area which is smaller than an area occupied by the macro cell 1.

Signals flow from the input terminal region 11 to the macro cells 2 through the macro cells 1, and the signal flow is approximately uniform and directional in that the signals flow from the mutually confronting sides (top and bottom sides in FIG. 14) towards the central portion of the gate array device. Because the signal flow is approximately uniform and directional, it is easier to shorten the interconnections and make the lengths of the interconnections uniform.

When the upper and lower regions 18 and 19 of the macro cell region 15 are form symmetrical, it is possible to make the signal flow approximately symmetrical between the upper and lower regions 18 and 19. This symmetrical configuration facilitates the design of the gate array device.

When outputs of the macro cells 2 are formed towards the output terminal region 12, the signal flow from the macro cell region 15 to the output terminal region 12 becomes easy to control, and the interconnections from the macro cell region 15 to the output terminal region 12 can be made short.

In addition, the integration density of the gate array device is improved because the macro cell 2 occupies an area smaller than an area occupied by the macro cell 1.

Figure 15:
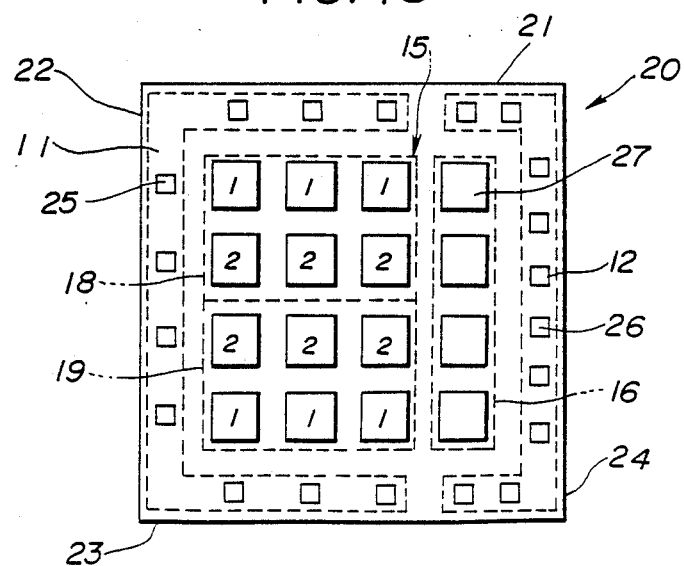
FIG. 15 is a plan view showing the second embodiment in more detail.

FIG. 15 shows the second embodiment in more detail. In FIG. 15, a semiconductor chip 20 has a rectangular shape having a first side 21, a second side 22, a third side 23, and a fourth side 24. The group of terminals are arranged in the peripheral region of the semiconductor chip 20 along the four sides 21 through 24. The input terminal region 11 including a group of input terminals 25 has a sideways approximate U-shape. This input terminal region 11 is a continuous peripheral region formed along a portion of the side 21, the full length of the side 22, and a portion of the side 23. On the other hand, the output terminal region 12 including a group of output terminals 26 has a sideways approximate U-shape confronting the sideways approximate U-shape of the input terminal region 11. This output terminal region 12 is a continuous peripheral region formed along a portion of the side 21, the full length of the side 24, and a portion of the side 23.

The macro cell region 15 is formed in a region between the portions of the input terminal region 11 along the confronting sides 21 and 23. In other words, the macro cell region 15 is formed substantially within the sideways approximate U-shape of the input terminal region 11. In the upper region 18 of the macro cell region 15, the row of macro cells 1 and the row of macro cells 2 are arranged downwardly from the top portion of the upper region 18. On the other hand, in the lower region 19 of the macro cell region 15, the row of macro cells 1 and the row of macro cells 2 are arranged upwardly from the bottom portion of the lower region 19. As described before, the macro cells 1 are suited for forming the master part of the master-slave flip-flop circuit and the macro cells 2 are suited for forming the slave part of the master-slave flip-flop circuit.

The output buffer region 16 including a group of output buffers 27 is formed between the macro cell region 15 and the output terminal region 12.

In the master-slave flip-flop circuit, the input signal is applied to the master part and the output signal is output from the slave part. Hence, the signals generally flow from the mutually confronting sides 21 and 23 of the semiconductor chip 20 towards the central portion of the semiconductor chip 20. As a result, it is possible to make the lengths of the interconnections short and uniform.

In addition, the signal interference between the input and output terminals 25 and 26 is virtually eliminated because the group of input terminals 25 is formed in the input terminal region 1 which is independent and separated from the output terminal region 12 which includes the group of output terminals 26.

When forming the master-slave flip-flop circuit, the master part is formed from the macro cell 1 which is exclusively designed for the master part and the slave part is formed from the macro cell 2 which is exclusively designed for the slave part, although it is, of course possible to form circuits other than the master and slave parts from the macro cells 1 and 2. For this reason, the number of elements included in the macro cell 2 and the area occupied thereby can be reduced compared to the macro cell 1. The number of unused elements is reduced compared to the conventional gate array device when forming the master-slave flip-flop circuit, and the integration density of the gate array device can be improved.

Figure 16:
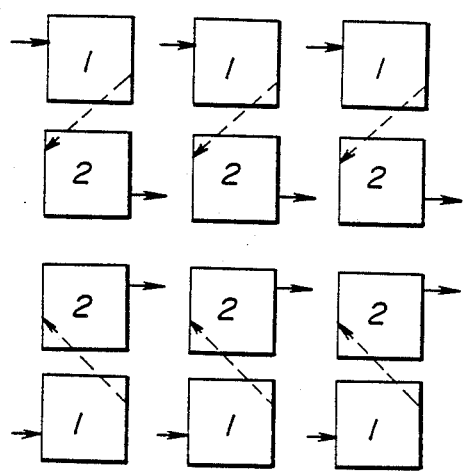
FIG. 16 schematically shows a flow of signals in a macro cell region of the second embodiment.

When forming the master-slave flip-flop circuits from the macro cells 1 and 2, it is desirable that the macro cells 1 and 2 are arranged symmetrically in the upper and lower regions 18 and 19 of the macro cell region 15. FIG. 16 schematically shows the flow of signals when each of the macro cells 1 and 2 receive an input signal from the left portion and outputs an output signal from the right portion and the arrangement of the macro cells 1 and 2 is symmetrical about a boundary between the upper and lower regions 18 and 19 of the macro cell region 15. As may be seen from FIG. 16, the symmetrical arrangement of the macro cells 1 and 2 in the upper and lower regions 18 and 19 of the macro cell region 15 and the restriction to output the output signal of each of the macro cells 1 and 2 from only the right portion thereof make it possible to concentrate the signal flow generally from the mutually confronting sides 21 and 23 towards the central portion of the semiconductor chip 20. In addition, the output signals of the master-slave flip-flop circuits flow approximately parallel to each other towards the output buffer region 16 and the output terminal region 12 without intersecting each other. Therefore, by employing the arrangement or orientation shown in FIG. 16, the interconnections running towards the output terminal region 12 are collected, and the lengths of the interconnections can be shortened and made approximately uniform. p In FIGS. 14 and 15, only one row of the macro cells 1 and one row of the macro cells 2 are formed in each of the upper and lower regions 18 and 19 of the macro cell region 15 for the sake of simplifying the drawings. However, it is of course possible to arrange more than one row of the macro cells 1 and more than one row of the macro cells 2. In addition, the macro cells 1 and 2 may be arranged within the macro cell region 15 in conformance with the layout patterns described before in conjunction with FIGS. 5 through 8, for example.

Figure 17:
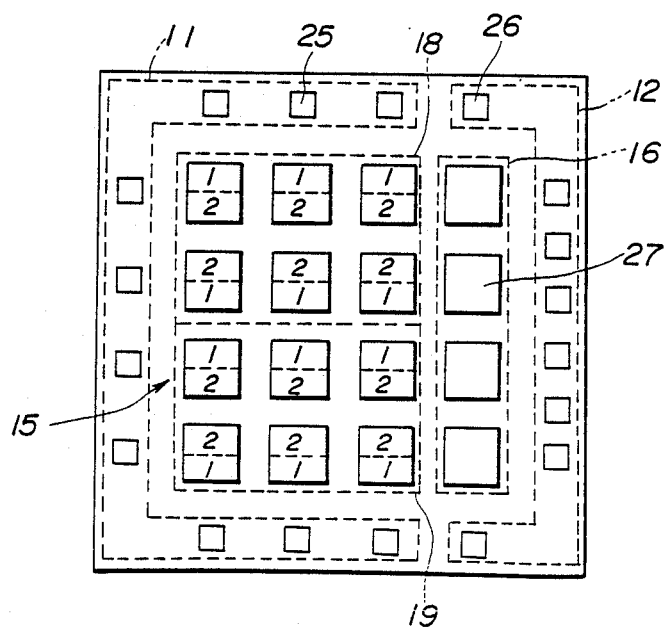
FIG. 17 is a plan view showing a layout pattern of the macro cells of the second embodiment.

FIG. 17 shows the second embodiment which employs the layout of the macro cells 1 and 2 shown in FIG. 5 in both the upper and lower regions 18 and 19 of the macro cell region 15. In FIG. 17, those parts which are the same as those corresponding parts in FIGS. 14 and 15 are designated by the same reference numerals, and a description thereof will be omitted.

Figure 18:
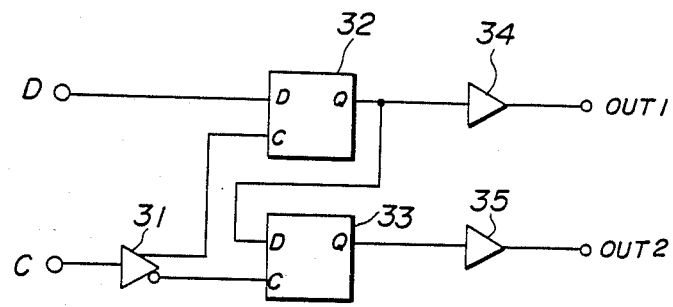
FIG. 18 is a system circuit diagram showing a logic circuit which may be formed in the second embodiment.

FIG. 18 shows a logic circuit which may be formed in the second embodiment of the gate array device. The logic circuit shown in FIG. 18 has an OR/NOR gate 31, flip-flops 32 and 33, and output gates 34 and 35 which are connected as shown. An input data signal is applied to a data input terminal D, and a clock signal is applied to a clock input terminal C. Output signals are output from output terminals OUT1 and OUT2.

Figure 19:
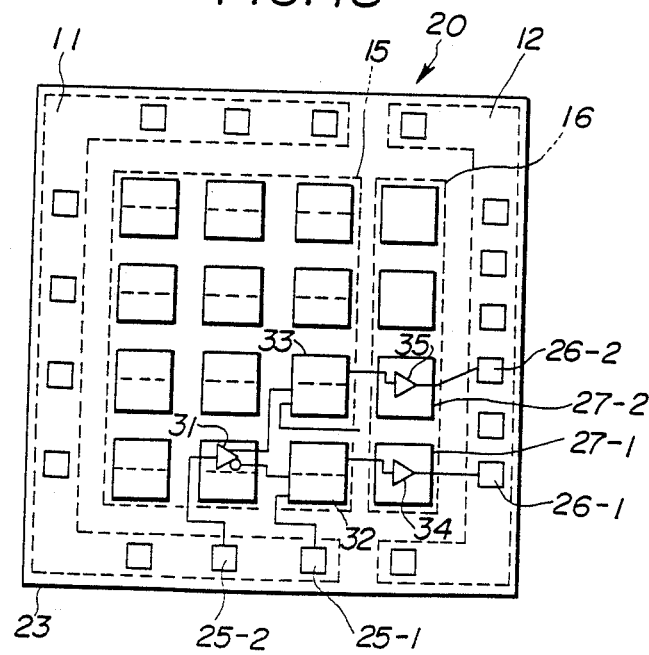
FIG. 19 is a plan view generally showing an embodiment of interconnections for forming the logic circuit shown in FIG. 18 in the gate array device shown in FIG. 15.

FIG. 19 shows an embodiment of the general interconnections for forming the logic circuit shown in FIG. 18 in the gate array device shown in FIG. 17. Input terminals 25-1 and 25-2 of the input terminal region 11 are respectively used as the data input terminal D and the clock input terminal C. Three macro cell pairs are used to form the OR/NOR gate 31 and the two flip-flops 32 and 33, and output buffers 27-1 and 27-2 are respectively used to form the output gates 34 and 35. Each macro cell pair consists of one macro cell 1 and one macro cell 2. The input to each macro cell pair is applied from the left side and the output from each macro cell pair is output from the right side in FIG. 19. Output terminals 26-1 and 26-2 are respectively used as the output terminals OUT1 and OUT2. Therefore, the signal flow in this case is generally from the side 23 towards the central portion of the semiconductor chip 20 and then horizontally towards the output buffer region 16 and the output terminal region 11.

Figure 20:
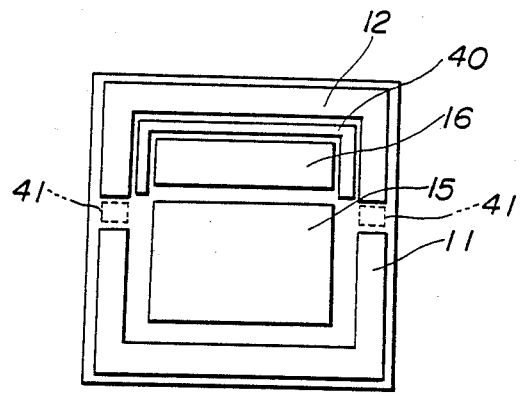
FIG. 20 is a plan view generally showing a third embodiment of the gate array, device according to the present invention for explaining the basic concept thereof.

Next, a description will be given of a third embodiment of the gate array device according to the present invention. FIG. 20 generally shows the third embodiment for explaining the basic concept thereof. In FIG. 20, those parts which are substantially the same as those corresponding parts in FIG. 14 are designated by the same reference numerals, and a description thereof will be omitted. In FIG. 20, an interconnection region 40 is formed between the output buffer region 16 and the output terminal region 12, and power source terminal regions 41 are formed between the input terminal region 11 and the output terminal region 12. The interconnections connecting the output buffers 27 of the output buffer region 16 and the output terminals 26 of the output terminal region 12 are formed in the interconnection region 40, and the arrangement of the interconnection region 40 prevents intersections of the interconnections between the output buffer region 16 and the output terminal region 12. Terminals for supplying power source voltages are formed in the power source terminal regions 41 which isolate the input terminal region 11 and the output terminal region 12.

Because the interconnections formed in the interconnection region 40 do not intersect each other, it is possible to make the lengths of the interconnections uniform. In addition, by the isolation between the input terminal region 11 and the output terminal region 12 provided by the power source terminal regions 41, it is possible to substantially eliminate the signal interference between the input terminals 25 of the input terminal region 11 and the output terminals 26 of the output terminal region 12.

Figure 21:
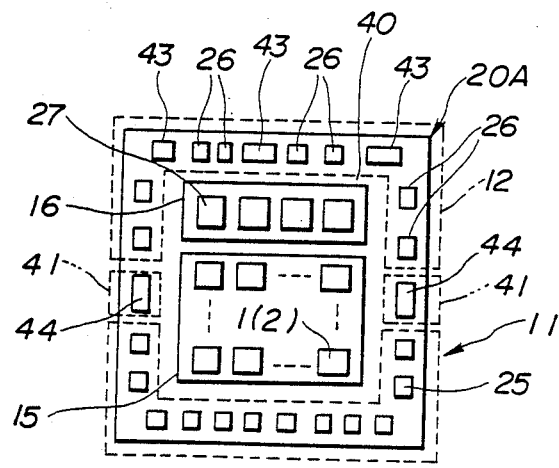
FIG. 21 is a plan view stowing the third embodiment in more detail.

FIG. 21 shows the third embodiment in more detail. In FIG. 21, those parts which are substantially the same as those corresponding parts in FIG. 15 are designated by the same reference numerals, and a description thereof will be omitted. The regions of a semiconductor chip 20A shown in FIG. 21 are basically the same as those of the semiconductor chip 20 shown in FIG. 15 which is rotated 90 degrees counterclockwise. The basic differences between the semiconductor chips 20A and 20 are that the semiconductor chip 20A has the power source terminal regions 41 in which power source terminals 44 are formed, and that power source terminals 43 are formed in addition to the output terminals 26 in the output terminal region 12. The layout of the macro cells 1 and 2 within the macro cell region 15 may be set arbitrarily.

Figure 22:
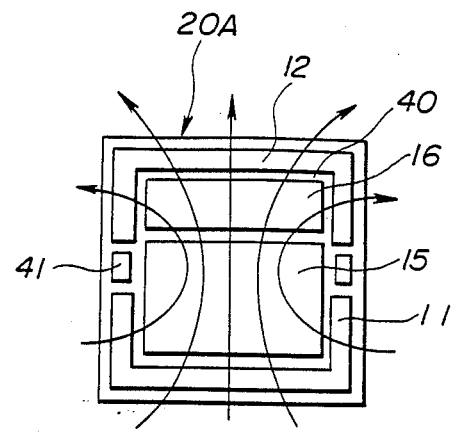
FIG. 22 shows a flow of high-speed (high-frequency) signals in the gate array device shown in FIGS. 20 and 21.

FIG. 22 shows a flow of high-speed (high-frequency) signals in the gate array device shown in FIGS. 20 and 21. The high-speed signals flow from the input terminal region 11 at the lower peripheral portion of the semiconductor chip 20A towards the central portion and are subjected to logic operations in the macro cell region 15. The signals output from the macro cell region 15 are subjected to amplification and wave-shaping in the output buffer region 16 and flow towards the output terminal region 12 at the upper peripheral portion of the semiconductor chip 20A. In other words, the signal flow is generally from the lower peripheral portion to the upper peripheral portion of the semiconductor chip 20A via the central portion, and the regions 11, 12, 15, 16 and the like are arranged so that there is no flow of high-speed signals in a direction opposite to this general signal flow.

The signal interference to the input signal caused by a change in the output signal which introduces an induction change of the input signal, the skew which is caused by a phase error between the signals and the like give rise to problems when the signals are high-speed (high-frequency) signals. For this reason, it is not essential that the above described arrangement of the regions of the semiconductor chip 20A is used with respect to low-speed (low-frequency) signals.

The location or distribution of the power source terminals 41 and 43 is not limited to that shown in FIG. 21. However, the location shown in FIG. 21 leads to the following advantages. That is, the power source terminal 41 is located between the input terminal region 11 and the output terminal region 12 and has a shielding effect. When the potential at the output terminals 26 located in the lower portion of the output terminal region 12 suddenly changes, this sudden change in potential would ordinarily affect the input terminals 25 located in the upper portion of the input terminal region 11. But because the power source terminals 44 are provided between the input terminal region 11 and the output terminal region 12, the effects of the sudden change in potential are minimized by the power source terminals 44 which have constant potentials. Similarly, the potentials at two mutually adjacent output terminals 26 affect each other, but such effects are minimized by providing the power source terminal 43 between the two output terminals 26. Normally, two output terminals 26 are provided with respect to one output buffer 27. Accordingly, the output terminals 26 may be paired and the mutual interference between the output terminals 26 may be minimized by providing one power source terminal 43 between two mutually adjacent output terminal pairs.

Although the general signal flow is from the bottom to the top of the semiconductor chip 20A in FIG. 22, the direction of the general signal flow is of course not limited to such.

Next, a description will be given of fourth and fifth embodiments of the gate array device according to the present invention. The fourth and fifth embodiments are designed to generate a flow of signals different from that of the third embodiment.

Figure 23:
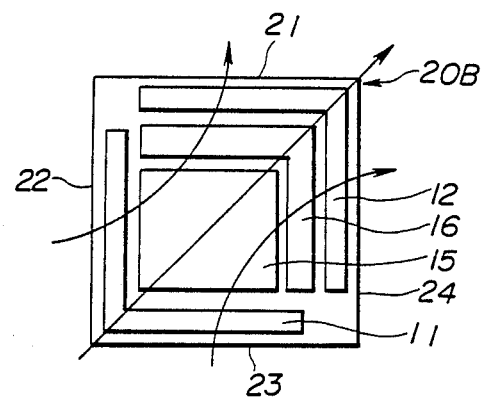
FIG. 23 is a plan view generally showing a fourth embodiment of the gate array device according to the present invention for explaining the basic concept thereof.

FIG. 23 generally shows the fourth embodiment for explaining the basic concept thereof. In FIG. 23, those parts which are substantially the same as those corresponding parts in FIG. 20 are designated by the same reference numerals, and a description thereof will be omitted. In FIG. 23, the input terminal region 11 is formed along the two mutually adjacent sides 22 and 23 of a semiconductor chip 20B as one continuous region. The output terminal region 12 is formed along the two mutually adjacent sides 21 and 24 of the semiconductor chip 20B as one continuous region and confronts the input terminal region 11. The macro cell region 15 is formed at a lower left part of the central portion of the semiconductor chip 20B. The output buffer region 16 is formed at an upper right part of the central portion of the semiconductor chip 20B between the macro cell region 15 and the output terminal region 12. The signal flow is approximately parallel to a diagonal line from the lower left towards the upper right of the semiconductor chip 20B.

Figure 24:
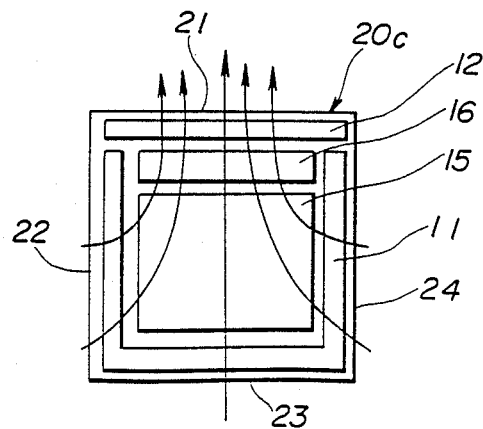
FIG. 24 is a plan view generally showing a fifth embodiment of the gate array device according to the present invention for explaining the basic concept thereof.

FIG. 24 generally shows the fifth embodiment for explaining the basic concept thereof. In FIG. 24, those parts which are substantially the same as those corresponding parts in FIG. 20 are designated by the same reference numerals, and a description thereof will be omitted. In FIG. 24, the input terminal region 11 is formed along the three adjacent sides 22, 23 and 24 of a semiconductor chip 20C as one continuous region having an approximate U-shape. The output terminal region 12 is formed along the side 21 and confronts the approximate U-shape of the input terminal region 11. The macro cell region 15 is formed at the central portion of the semiconductor chip 20C and the output buffer region 16 is formed at the upper part of the central portion of the semiconductor chip 20C. The signal flow is approximately from the lower portion to the top side 21 of the semiconductor chip 20C. This embodiment is especially suited for a case where the number of input terminals is greater than that of the output terminals. The arrangement of the input terminal region 11 and the output terminal region 12 may be switched when the number of the output terminals is greater than that of the input terminals.

Of course, the location of the input terminal region and the output terminal region is not limited to those described heretofore. Similar effects are obtainable as long as the input terminals and the output terminals are grouped independently into two groups and each group is arranged within one continuous region so that the input terminal region and the output terminal region confront each other via the central portion of the semiconductor chip. In most cases, the input terminal region and the output terminal region are provided along two mutually confronting sides of a rectangular semiconductor chip.

Figure 25:
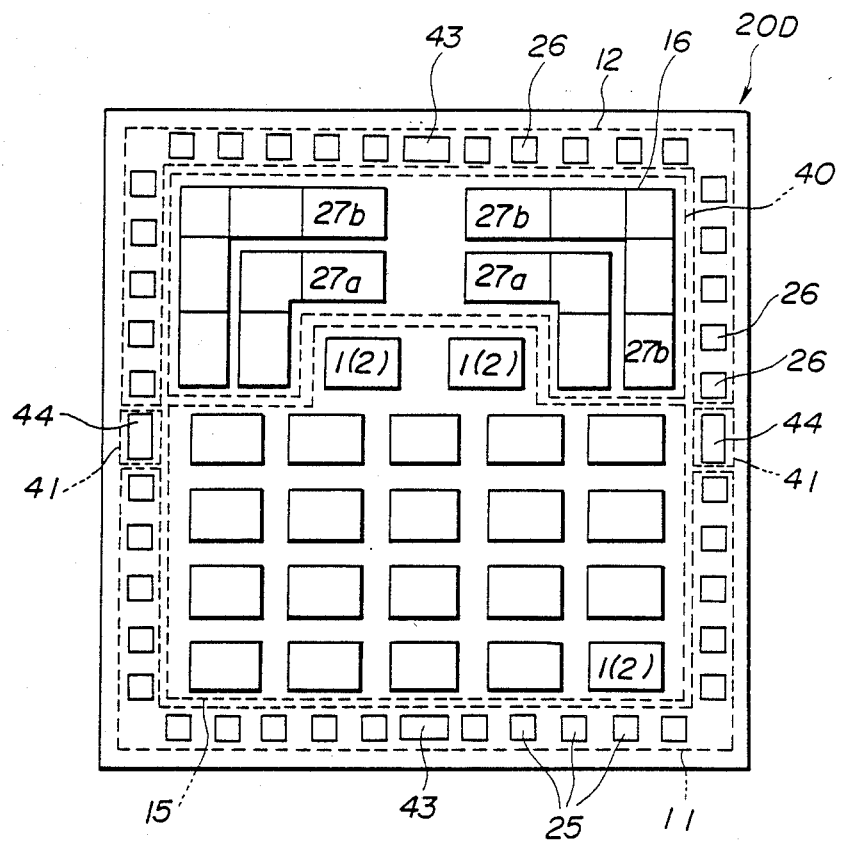
FIG. 25 is a plan view generally showing a sixth embodiment of the gate array device according to the present invention.

Next, a description will be given of a sixth embodiment of the gate array device according to the present invention. FIG. 25 generally shows the third embodiment for explaining the basic concept thereof. In FIG. 25, those parts which are substantially the same as those corresponding parts in FIG. 21 are designated by the same reference numerals, and a description thereof will be omitted. In FIG. 25, a semiconductor chip 20D has eleven (11) terminals per side. The power source terminals 43 and 44 are respectively located at a center of corresponding sides of the semiconductor chip 20D. The input terminal region 11 is located at a lower peripheral portion of the semiconductor chip 20D while the output terminal region 12 is located at an upper peripheral portion of the semiconductor chip 20D, and the power source terminals 44 are located at a boundary portion between the input and output terminal regions 11 and 12. The input terminal region 11 includes twenty (20) input terminals 25 for receiving high-speed (high-frequency) signals and one (1) power source terminal 43. The output terminal region 12 includes twenty (20) output terminals 26 for outputting high-speed (high-frequency) signals and one (1) power source terminal 43. It is of course possible to provide one power source terminal 43 for every two output terminals 26 as in the case of the third embodiment shown in FIG. 21.

The macro cell region 15 is arranged at the lower part of the central portion of the semiconductor chip 20D and is surrounded by the input terminal region 11 and the power source terminals 44. The macro cells 1 (and-/or 2) are regularly arranged in a lower portion of the macro cell region 15 in a matrix arrangement having four row and five columns, and two macro cells 1 (and-/or 2) are arranged in an upper portion of the macro cell region 15. Because of the shape of the macro cell region 15, an region having an approximately constant width is formed between the macro cell region 15 and the output terminal region 12. An OR circuit, an AND circuit, a flip-flop circuit or the like can be formed from each of the macro cells 1 (and/or 2), and the macro cell region 15 as a whole constitutes a logic operation part.

The output buffer region 16 includes output buffers 27a and 27b for subjecting the signals after the logic operation to amplification, wave-shaping and the like. Six (6) output buffers 27a are provided in a first stage of the output buffer region 16, and six (6) output buffers 27b are provided in a second stage of the output buffer region 16. The output buffers 27b are provided adjacent to and in correspondence with the output buffers 27a. Each output buffer 27b in the second stage of the output buffer region 16 is provided adjacent to and in correspondence with one output terminal 26 of the output terminal region 12. In other words, the output buffers 27a, the output buffers 27b, and the output terminals 26 are approximately aligned so as to generate a flow of signals which do not cross from the inside to the outside of the semiconductor chip 20D. Therefore, the interconnections which are formed in the interconnection region 40 between the second stage of the output buffer region 16 and the output terminal region 12 do not intersect each other, and the interference between signals is positively prevented.

Figure 26:
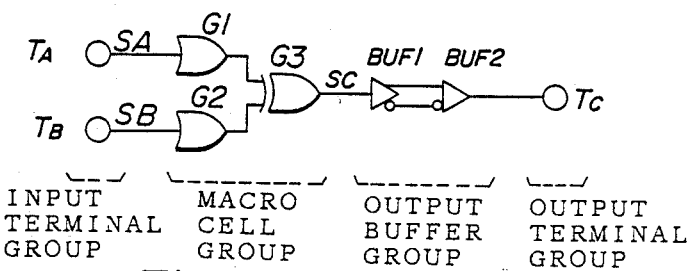
FIG. 26 is a circuit diagram for explaining a flow of signals in the sixth embodiment.
Figure 27:
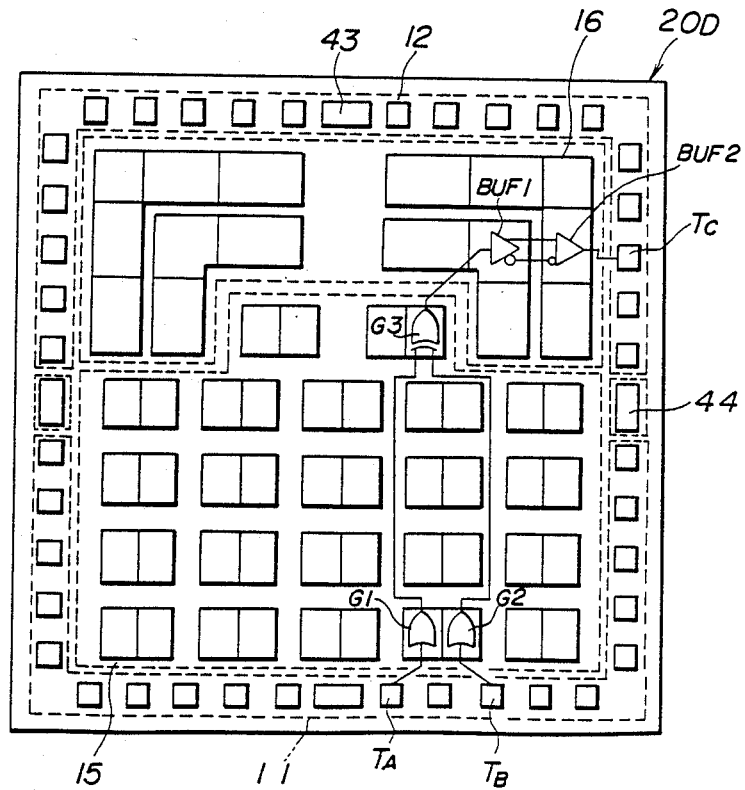
FIG. 27 is a plan view for explaining the flow of signals in the sixth embodiment.

FIG. 26 is a circuit diagram for explaining a flow of high-speed (high-frequency) signals in the sixth embodiment, and FIG. 27 is a plan view for explaining the flow of the high-speed (high-frequency) signals in the sixth embodiment.

In FIG. 26, a high-speed signal SA is applied to an input terminal $T_A$ and a high-speed signal SB is applied to an input terminal $T_B$. The high-speed signals SA and SB are supplied to a gate G3 through respective gates G1 and G2. A high-speed signal SC which is outputted from the gate G3 wherein a logic operation is carried out is amplified and shaped in output buffers BUF1 and BUF2 and is outputted through an output terminal $T_C$. FIG. 27 shows an embodiment of the flow of signals of the circuit shown in FIG. 26 on the semiconductor chip 20D.

Figure 28:
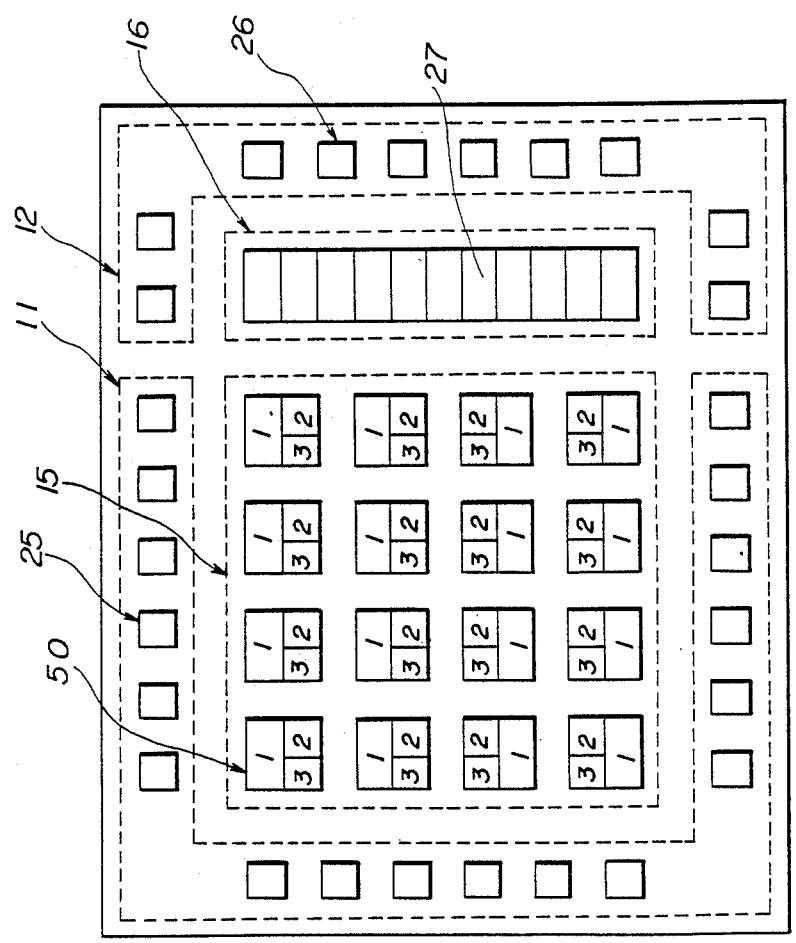
FIG. 28 is a plan view generally showing a seventh embodiment of the gate array device according to the present invention.

Next, a description will be given of a seventh embodiment of the gate array device according to the present invention. FIG. 28 generally shows the seventh embodiment. In FIG. 28, those parts which are substantially the same as those corresponding parts in FIG. 14 are designated by the same reference numerals, and a description thereof will be omitted. In this seventh embodiment, macro cell groups 50 are regularly arranged in a matrix arrangement within the macro cell region 15. Each macro cell group 50 consists of the macro cell 1 which is suited for forming a master part of a master-slave flip-flop circuit, the macro cell 2 which is suited for forming a slave part of the master-slave flip-flop circuit, and the macro cell 3 which is suited for forming a bias voltage source circuit. The arrangement of the macro cells 1, 2, and 3 in the macro cell groups 50 located in the upper part of the macro cell region 15 is symmetrical to that of the macro cells 1, 2, and 3 in the macro cells located in the lower part of the macro cell region 15.

Further, the present invention is not limited to these embodiments, but various variations and modifications may be made without departing from the scope of the present invention.

WHAT IS CLAIMED IS

1. A gate array device which forms an arbitrary logic circuit depending on interconnections formed thereon, said gate array device comprising:
   a semiconductor chip having an approximate rectangular shape;
   an input terminal region including a plurality of input terminals formed at a peripheral portion of said semiconductor chip;
   an output terminal region including a plurality of output terminals formed at a peripheral portion of said semiconductor chip; and
   a macro cell region including a plurality of macro cells formed at a central portion of said semiconductor chip,
   said macro cells including first macro cells and second macro cells, each of said first macro cells including a minimum number of elements for forming a master part of a master-slave flip-flop circuit, each of said second macro cells including at least a minimum number of elements for forming a slave part of the master-slave flip-flop circuit,
   said first macro cells and said second macro cells making macro cell pairs and being regularly arranged within said macro cell region.

2. The gate array device as claimed in claim 1 wherein said macro cell region includes a row of said first macro cells and a row of said second macro cells which are alternately arranged.

3. The gate array device as claimed in claim 1 wherein said macro cell region includes a repetition of a basic row pattern, said basic row pattern being made up of a row of said first macro cells, a row of said second macro cells, a row of said second macro cells, and a row of said first macro cells.

4. The gate array device as claimed in claim 1 wherein said macro cell region is made up of a first region and a second region which are bounded on a boundary, said first and second macro cells having a form symmetrical arrangement about the boundary.

5. The gate array device as claimed in claim 1 wherein said macro cells further includes third macro cells, said first through third macro cells having a regular arrangement within said macro cell region.

6. The gate array device as claimed in claim 5 wherein each of said third macro cells include at least a minimum number of elements for forming a bias voltage source circuit.

7. The gate array device as claimed in claim 1 wherein said semiconductor chip sequentially has first through fourth sides, said input terminal region being arranged at least along the first side of said semiconductor chip, said output terminal region being arranged at least along the third side of said semiconductor chip, said first side confronting said third side.

8. The gate array device as claimed in claim 7 wherein said first and second macro cells have inputs on a side thereof facing the first side of said semiconductor chip and outputs on a side thereof facing the third side of said semiconductor chip.

9. The gate array device as claimed in claim 7 wherein said input terminal region is arranged continuously along the first side and portions of the second and fourth sides of said semiconductor chip.

10. The gate array device as claimed in claim 7 wherein said output terminal region is arranged continuously along the third side and portions of the second and fourth sides of said semiconductor chip.

11. The gate array device as claimed in claim 7 wherein said input terminal region has an approximate U-shape arranged along the first side and portions of the second and fourth sides of said semiconductor chip and said output terminal region has an approximate U-shape arranged along the third side and portions of the second and fourth sides so as to confront the approximate U-shape of said input terminal region.

12. The gate array device as claimed in claim 11 wherein said macro cell region is substantially located within the approximate U-shape of said input terminal region.

13. The gate array device as claimed in claim 12 wherein said cell region is made up of a first region and a second region bounded on a boundary, said first region being arranged close to the second side of said semiconductor chip, said second region being arranged close to the fourth side of said semiconductor chip, said first and second macro cells having a form symmetrical arrangement about the boundary.

14. The gate array device as claimed in claim 12 which further comprises an output buffer region including a plurality of output buffers, said output buffer region being substantially located within the approximate U-shape of said output terminal region between said macro cell region and said output terminal region.

15. The gate array device as claimed in claim 7 wherein at least one of said input terminal region and said output terminal region further includes power source voltage terminals.

16. The gate array device as claimed in claim 7 which further comprises a power source terminal region formed between said input terminal region and said output terminal region, said power source terminal region including at least one power source terminal.

17. The gate array device as claimed in claim 7 wherein said semiconductor chip sequentially has first through fourth sides, said input terminal region being arranged along the first and second sides of said semiconductor chip, said output terminal region being arranged along the third and fourth sides of said semiconductor chip.

18. The gate array device as claimed in claim 17 which further comprises an output buffer region including a plurality of output buffers, said output buffer region being substantially located along said output terminal region, each of the output buffers of said output buffer region corresponding to one of the output terminals of said output terminal region.

19. The gate array device as claimed in claim 1 wherein each of said first macro cells occupy within said macro cell region an area greater than an area occupied by each of said second macro cells.

20. The gate array device as claimed in claim 1 which further comprises an interconnection region formed between said macro cell region and said output terminal region of said semiconductor chip, said interconnection region being formed with non-intersecting interconnections when forming the arbitrary logic circuit.

* * * * *